United States Patent [19]

Nelson

[11] Patent Number: 5,478,425

[45] Date of Patent: Dec. 26, 1995

[54] METHOD OF MAKING A THIN FILM DETECTOR WITH AN AEROGEL LAYER

[75] Inventor: Elizabeth H. Nelson, Springfield, Va.

[73] Assignee: The United States of America as represented by the Secretary of the Army, Washington, D.C.

[21] Appl. No.: 307,208

[22] Filed: Sep. 16, 1994

Related U.S. Application Data

[62] Division of Ser. No. 823,749, Jan. 22, 1992, Pat. No. 5,300,807.

[51] Int. Cl.⁶ .......................... B29C 39/02; B29C 39/36
[52] U.S. Cl. .............. 156/246; 156/306.3; 204/192.14; 264/298
[58] Field of Search ..................... 156/246, 285, 156/306.3; 264/298; 257/632, 642, 643, 702; 204/192.14

[56] References Cited

U.S. PATENT DOCUMENTS

| | | | |
|---|---|---|---|
| 2,631,334 | 3/1953 | Bailey | 264/298 |
| 2,689,187 | 9/1954 | Thomsen | 264/298 |
| 3,975,225 | 8/1976 | Bottenbruch et al. | 264/298 |
| 4,465,533 | 8/1984 | Covitch | 156/264 |
| 4,819,057 | 4/1989 | Naito et al. | 264/298 |
| 5,106,561 | 4/1992 | Singh et al. | 264/298 |

OTHER PUBLICATIONS

The Preparation of Very Thin Plastic Films, Fry et al, U.S. Atomic Energy Commission, Jan. 30, 1948.

Primary Examiner—Michael W. Ball
Assistant Examiner—Richard Crispino
Attorney, Agent, or Firm—Milton W. Lee; John E. Holford; Anthony T. Lane

[57] ABSTRACT

The invention is related to electronic and more specifically to photo-electronic devices manufactured by means of thin film layering techniques. The invention proposes the use of polymer, copolymer, polyamide and similar organic casting materials, in layers 500 to 10,000 angstroms thick, as protective barriers between layers where the processing of one layer would be adversely affected by or would damage an adjacent previously formed layer.

2 Claims, 3 Drawing Sheets

METHOD OF MAKING A THIN FILM DETECTOR WITH AN AEROGEL LAYER

The invention described herein may be manufactured, used, and licensed by the U.S. Government for governmental purposes without the payment of any royalties thereon. This application is a division of application Ser. No. 07/823,749, now U.S. Pat. No. 5,300,807, filed 22 Jan. 1992.

BACKGROUND OF THEM INVENTION

1. Field

The invention is related to electronic and photoelectronic devices manufactured by means of thin film and monolithic layering techniques.

2. Prior Art

Most electronic devices are now made using thin layers of material on a supporting substrate. This has led to the evolution of monolithic semiconductor devices wherein the active portions of a device reside in a single crystal of silicon, germanium, gallium arsenide, mercury cadmium telluride, and various other similar types of materials. These monolithic devices are now being combined with one another and other thin film structures to form more exotic devices. For example, an array of gallium arsenide photodetectors which operate in the far-infrared have been combined with a silicon charged-coupled-device originally designed for use with visible light detectors made of silicon. Such detectors may be photovoltaic devices, photoconductors or pyroelectric devices. To interface these devices; with each other, a support structure and an optical input element; involves further layering techniques. Some of the layering techniques involve electrical isolation or conduction, thermal isolation, differential thermal expansion, and surface architecture such as crystal lattices and larger irregularities. An object of this invention is to provide a specially prepared thin, flat mechanically stable and/or chemically resistant organic layer, to interface otherwise incompatible surface layers of microelectronic devices, and the method of making and using this layer.

SUMMARY OF THE INVENTION

The invention provides a structure and method wherein a barrier layer is formed between two sequential layers of an electronic device which are incompatible. For example, in a thermal or far-infrared photo sensor array, it would be desirable to deposit a silicon dioxide layer and/or a common electrode on an aerogel substrate. The latter is an excellent light weight thermal insulator with good dimensional stability but its surface is too delicate and porous for electroplating, thermal evaporation, sputtering or wet chemical processing. Due to the nature of aerogel materials, a dry process must be used to join the barrier layer to the aerogel substrate. The barrier layer is formed separately from the substrate and the other layers to achieve a flat structure of uniform thickness and to avoid chemical and physical damage to the substrate or layers. When the completed barrier layer contacts the substrate, it bonds thereto and can be coated by vacuum sputtering or the other methods mentioned above.

BRIEF DESCRIPTION OF THE DRAWINGS

The invention is best understood with reference to the drawings wherein.

DESCRIPTION OF THE PREFERRED EMBODIMENT

Electronic devices, and particularly microelectronic devices, are usually formed in-situ on some form of substrate. Often the substrate is chosen to facilitate formation of the device, as when the crystalline structure of the substrate is chosen to match the crystalline structure of a semiconductor used in the active layers of a device. At other times, a substrate may be part of another existing structure and may require properties such that direct formation of a device thereon is impractical. One example is a unique substrate material known as an aerogel originally developed as transparent insulation to separate the inner and outer panes of glass in a low heat loss window. This material was introduced in the early 1930's and usually consists of silica, alumina, zinconia, stannic oxide, tungsten oxide or mixtures thereof. Aerogels are sol-gel derived supercritically dried materials with porosities up to 98%. A description of this material and its fabrication is found in the article "AEROGELS - HIGHLY TENUOUS SOLIDS WITH FASCINATING PROPERTIES", by J. Frick *Journal of Noncrystalline Solids*, North Holland, Amsterdam), Vol. 100, No. 1–3, pp 169–173.

This material has many interesting qualities as a substrate. It is rigid, but extremely lightweight. It is an excellent thermal insulator and sound insulator. It is also transparent or translucent to visible light and a good absorber of infrared light. It has been suggested by applicant as a substrate for arrays of thermal infrared or pyroelectric detectors to prevent thermal interaction between detectors. These detectors; examples of which appear in applicant's copending application entitled "Ion Beam Etching of Metal Oxide Ceramics:", filed 30 Apr. 1991 and Pat. No. 4,927,771 for "Method of Thermal Isolation of Detector Elements in an Uncooled Staring Focal Plane Array" by Donald A. Ferrett, issued 22 May 1990; require a uniformly thin common electrode formed by ion-beam sputtering, RF sputtering, magnetron sputtering, etc. These processes would damage the delicate surface of the aerogel and deposit material into its pores thereby destroying the aerogel and producing an electrode with a very non-uniform thickness.

To prevent this, the present invention proposes the use of a barrier layer between the substrate and the electrode, which must be applied using a dry process. Many electronic devices involve this type of boundary, i.e. a boundary between a nonconducting substrate and a conducting or semiconducting layer. To form the barrier layer, it is preferred to use such materials as polymers, copolymers, and polyamides which can be formed into films between 500 to 10,000 angstroms thick.

Figure 1:
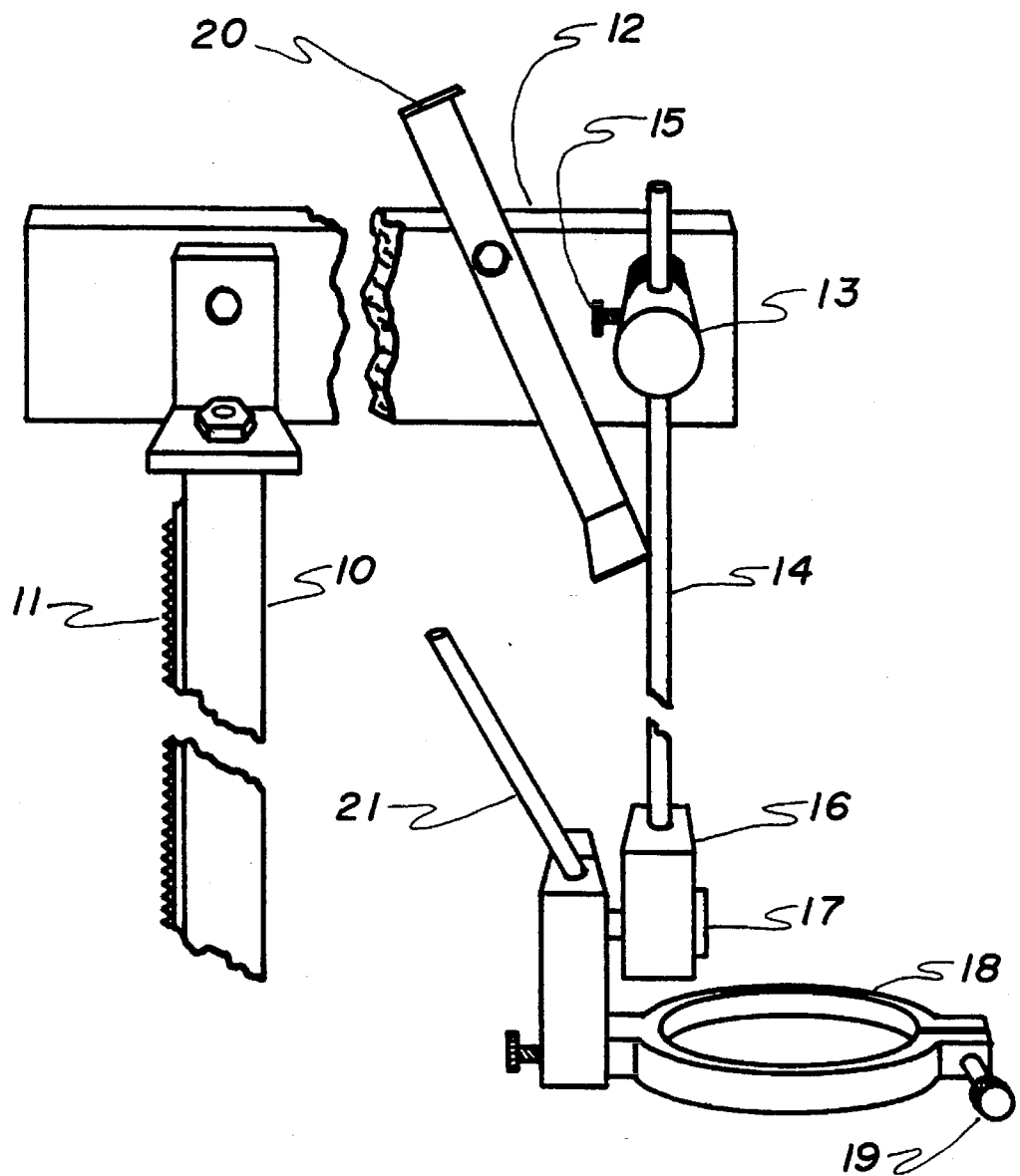
FIG. 1 shows a mechanical manipulator for the support rings on which the above mentioned barrier layer may be lifted.

FIG. 1 shows a manipulator used to handle such a film in its formation. The manipulator is mounted on a post 10 with a rack 11 attached so that it can engage a pinion or worm gear (not shown) attached to a table, to raise or lower the beam support 12 which extends parallel to the table. An upper axle member 13 extends through the distal end of the beam from the post also parallel to the table. A support rod 14 extends vertically through a hole in the axle member and is locked in place by a set screw 15. The lower end of the rod terminates in a bearing block 16 which supports a lower axle member 17, again, parallel to the table. The lower axle member is fixed to a ring clamp 18 with a clamping screw 19. The ring clamp has a circular opening slightly larger in diameter than the support rings to be used, which are nominally 2.5 inches; although this is not critical. A friction lever 20 pivoted on the beam presses against the vertical rod to level the ring clamp with the table top. A lower tilting lever 21 attached to the ring clamp permits leveling normal to that of the friction lever.

Figure 2:
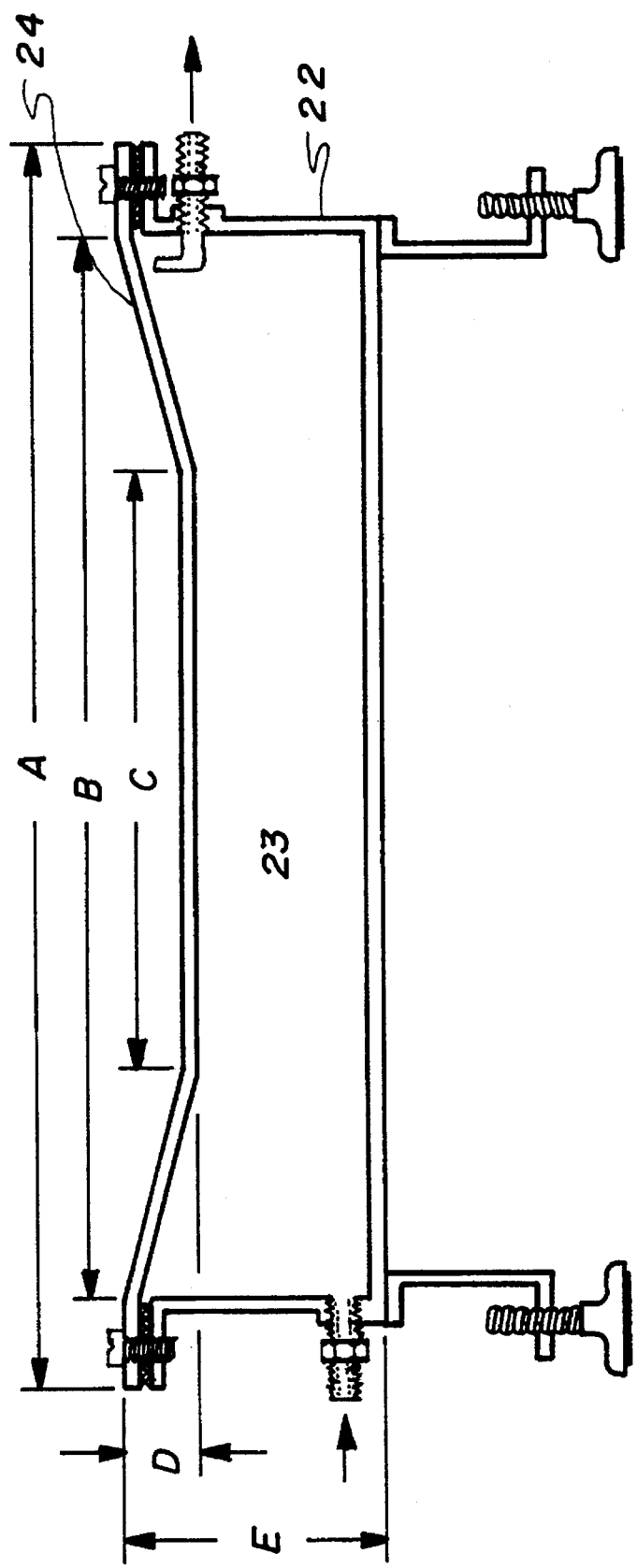
FIG. 2 shows a temperature controlled tray in which the barrier layer is first formed.

FIG. 2 shows a thermally controlled tray 22 in which the barrier layers may be formed. The square tray contains a closed chamber 23 through which warm water is circulated to maintain the desired operating temperature. The tray also has a top pan 24 with a flat bottom having a width C of about 6 inches. The bottom slopes upward to a width B of about 12 inches, providing a maximum depth D of about 0.75 inches. The overall width A of the tray is about 14 inches and the overall depth E is about 3 inches. The tray has four equispaced adjustable height legs attached to its lower corners to level the tray with its contents.

Figure 3:
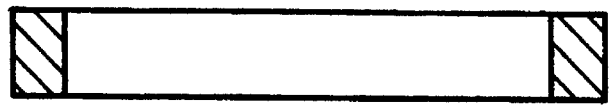
FIG. 3 shows a ring structure which presents a large contact area to the barrier layer.
Figure 4:
FIG. 4 shows a ring with significantly less contact area than the ring in FIG. 3.

FIGS. 3 and 4 show typical ring configurations used in making different barrier layers. The ring of FIG. 3 has a maximum diameter F of 2.75 inches and minimum diameter of 2.25 inches, thus providing about 2 square inches of contact on its bottom surface. The ring of FIG. 4 with maximum and minimum diameters of 2.5 inches and 2.0 inches and has a minimum radial thickness of 0.15 inch. It presents only 0.57 square inches of contact on its lower surface. All of the above may be formed from stainless steel, aluminum, or plastic. Circular rings are the easiest to fabricate, but frames of any shape can obviously be used, as desired. The tray may be lined with Teflon for easy cleaning.

Figure 5:
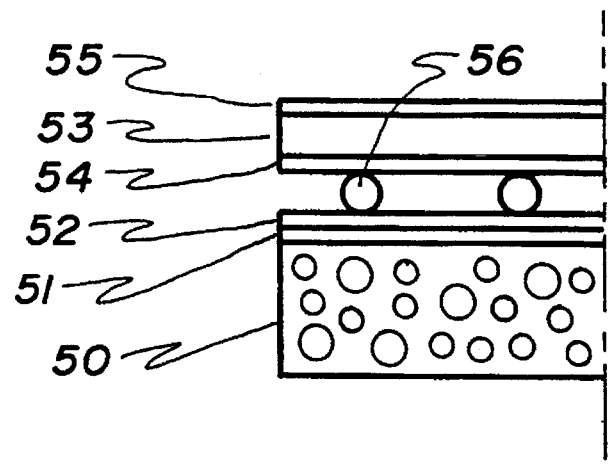

FIG. 5 shows the structure of an electrical device made according to present invention. The device has a substrate 50 incompatible with vacuum deposition, e.g., an aerogel. On this was placed a precast barrier layer 51. The barrier layer is covered with a layer 52 of electronic material, e.g., a gold electrode. Additional layers can then be added in the usual manner to form a complete device. These layers can be deposited directly on layer 52 or a layer 53 of pyroelectric or similar material and can be plated with conductive electrodes 54 and 55, one of which is attached with solder 56 to layer 52.

To form a barrier layer, the following steps are performed:

A. Filling the tray with a liquid subphase with sufficient density and surface tension to float a mixture of chosen organic barrier materials and solvents;

B. Circulating water under the tray at a fixed temperature a few degrees or more above room temperature to stabilize the rate of formation of the barrier layer;

C. Depositing a mixture of barrier material and solvent from a pipette onto the surface of the liquid subphase;

D. Viewing the spreading mixture to observe interference fringes of colors that appear at random over the entire surface of the mixture as it becomes a thin film, the film is relatively uniform in thickness and ready for lifting when the interference fringes fade away leaving a clear film;

E. Leveling and lowering a support ring by its supporting structure until it lightly contacts the barrier layer;

F. Lifting the barrier layer from the surface of the subphase by simultaneously lifting and tilting the support ring; cf. A skilled person can perform Steps e. and f. by hand using only a ring;

G. Sealing the ring and layer into a vacuum oven, baking the ring and layer to remove any remaining solvents, filling the oven with an inert gas atmosphere, this is best done in two cycles as indicated in Table II a short cycle in air and long cycle under vacuum;

H. Removing the ring and barrier layer from the vacuum oven;

I. Deriving the film thickness from the film's reflectivity at normal incidence and the film's index of refraction;

J. Labeling and storing the ring and barrier layer in a dry box;

K. Transferring the film, when needed, from the support ring to a solid substrate using a differential pressure such that contact with the substrate is made starting in the center of the substrate and moving out to the edges to expel any excess gases trapped between the two;

K1. Step K may also be done entirely by hand at 1 atmosphere or under full vacuum using a commercially available vacuum manipulator;

L. Sealing the substrate in a vacuum chamber equipped to coat substrates with one or more materials;

M. Evacuating the chamber;

N. Cooling the substrate and barrier layer to about 2° C.; and

O. Forming at least one thin uniform layer over the exposed broad surface of the barrier layer as, for example, by sputtering.

Table I lists a number of different barrier layer materials, solvents therefor, subphase liquids and subphase additives. This list is by no means exhaustive. Hundreds of similar materials will be evident to those skilled in the art. Applicant's barrier layers were originally prepared in a Formo Scientific Oven Model 3237, equipped with inert gas input and venting ports, however, to provide greater process control, Steps G through O may be performed continuous under vacuum in a multivestibule chamber. The barrier layer and the substrate would be placed in separate vestibules until the layer is dry and its vestibule evacuated, then both items would be located in to the same vestibule. Steps I and J, which are optional, would probably be omitted. The higher the melting point or sublimation temperature of the material in the barrier layer, the less likelihood they will be damaged when applying the first layer of the electronic device on it. The examples given have melting points of 1–3 hundred degrees C. These must be cooled during sputtering or the like, using water near 2° C. As better materials are found, this cooling will not be necessary. While the physical properties of the layers have been stressed, the chemical problems that arise between layers can be equally difficult. Some materials are poisoned by metal ions when adding electrodes. Some metal alloys contain mercury atoms which migrate easily into semiconductors. Some materials simply do not adhere to one another, but will adhere to a barrier material. Since most electrical devices generate heat, it will be beneficial in many cases to protect nearby elements by introducing an isolating aerogel layer as indicated above.

TABLE I

BARRIER LAYER FORMULATION EXAMPLES

| MATERIAL | GM | SOURCE | SOLVENT | ML | CLASS |
|---|---|---|---|---|---|
| Nitrocellulose | 3.5 | Generic | Ethylacetate | 12.5 | Polymer |
|  |  |  | Pentyl Acetate | 12.5 |  |
| Polyetherimide | 1.0 | Dupont | 1,2,3 Trichloropropane | 10.0 | Polymer |
| L.R. 4330 | 264 | GE | 1,2,3 Trichloropropane | 4.0 | Co-Polymer |
| L.R. 3320 | 132 | GE | 1,2,3 Trichloropropane | 2.0 | Polymer |
| XU-218 | 400 | CIBA | 1,2,3 Trichloropropane | 4.0 | Polyimide |

Subphase - Deionized water with 0.8% 1-Propanol @ 25° C.
Subphase Surface Tension: 64.3 dyne/cm @ 18° C.

TABLE II

BARRIER LAYER DRYING CYCLES

| CYCLE | TIME (Sec) | TEMP °C. | VACUUM TORR | BACKFILL |
|---|---|---|---|---|
| I | 90 | 90–100 | — | Air |
| II | 900 | 100–110 | 1.0 | Nitrogen |

I claim:

1. A method of depositing a thin uniform preselected layer of electrical material on an aerogel, said aerogel substrate having a surface incompatible for deposition of the preselected layer, comprising the steps of:

A Providing said aerogel substrate;

B. Depositing a barrier layer of organic material with a thickness between 500 and 10,000 angstroms on a liquid subphase;

C. Lifting said barrier from said subphase on a lifting frame;

D. Sealing said frame and barrier layer into a vacuum chamber;

E. Evacuating said chamber;

F. Heating said chamber, frame and barrier layer to evaporate any solvent or subphase liquids from said barrier layer;

G. Removing said frame and barrier layer form said chamber;

H. Transferring said barrier layer from said frame by pressing said barrier layer into contact with said substrate; and I. Depositing said preselected layer on said barrier layer.

2. The method according to claim 1, wherein step I includes the following substeps:

I1. Placing said substrate and barrier layer in a vacuum sputtering chamber,

I2. evacuating said sputtering chamber, and

I3. sputtering said preselected layer onto said barrier layer.

* * * * *